United States Patent [19]
Ausschnitt et al.

[11] Patent Number: 5,805,290
[45] Date of Patent: Sep. 8, 1998

[54] METHOD OF OPTICAL METROLOGY OF UNRESOLVED PATTERN ARRAYS

[75] Inventors: Christopher Perry Ausschnitt, Brookfield; Timothy Allan Brunner, Ridgefield, both of Conn.

[73] Assignee: International Business Machines Corporation, Armonk, N.Y.

[21] Appl. No.: 643,138

[22] Filed: May 2, 1996

[51] Int. Cl.⁶ .................................................. G01B 11/00
[52] U.S. Cl. ............................................................ 356/401
[58] Field of Search .................................. 356/399–401, 356/375; 250/548, 559.3; 355/43, 53, 67

[56] References Cited

U.S. PATENT DOCUMENTS

| | | |
|---|---|---|
| 4,529,314 | 7/1985 | Ports . |
| 4,568,189 | 2/1986 | Bass et al. . |
| 4,659,936 | 4/1987 | Kikkawa et al. . |
| 4,820,055 | 4/1989 | Müller . |
| 5,103,104 | 4/1992 | Tissier et al. . |
| 5,216,257 | 6/1993 | Brueck et al. . |
| 5,262,258 | 11/1993 | Yanagisawa . |
| 5,309,198 | 5/1994 | Nakagawa .................................. 355/67 |
| 5,402,224 | 3/1995 | Hirukawa et al. . |

FOREIGN PATENT DOCUMENTS

| | | |
|---|---|---|
| 57-60206A | 4/1982 | Japan . |
| 214920 | 10/1984 | United Kingdom . |

Primary Examiner—K. Hantis
Attorney, Agent, or Firm—DeLio & Peterson LLC; Peter W. Peterson; Aziz M. Ahsan

[57] ABSTRACT

A process for determining critical dimension bias or overlay error in a substrate formed by a lithographic process initially provides an array of elements on a substrate, the array comprising a plurality of spaced, substantially parallel elements having a length and a width. The sum of the width of an element and the spacing of adjacent elements define a pitch of the elements. Edges of the elements are aligned along a line forming opposite array edges, with the distance between array edges comprising the array width. An optical metrology tool used for measurement of the array is adjustable for one or more of i) wavelength of the light source, ii) numerical aperture value or iii) partial coherence. The process includes selecting the pitch of the elements, the wavelength of the light source, the numerical aperture and the partial coherence such that the pitch of the elements is less than or about equal to the ratio of the wavelength of the light source to the numerical aperture value of the optical metrology tool in the direction of the array edges whereby individual elements are not resolved within the array. The edges of the array are resolved with the optical metrology tool and the width of the array is measured to determine bias or overlay error in the substrate. Where the pitch of the array differs in different directions, the optical metrology tool has a non-circular pupil and the numerical aperture value NA of the optical metrology tool in the direction of minimum array pitch is selected to be less than the numerical aperture value NA of the optical metrology tool in a direction of maximum array pitch, such that the array edges are resolved and individual elements are not resolved.

20 Claims, 8 Drawing Sheets

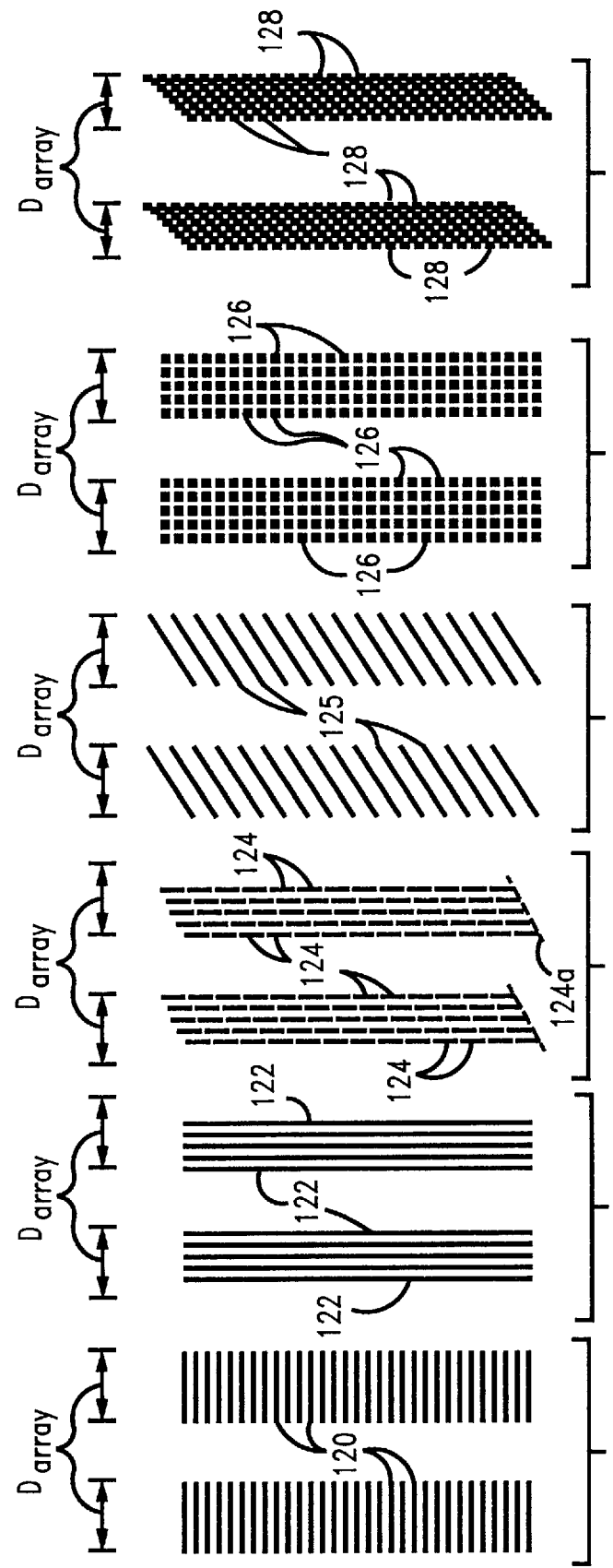

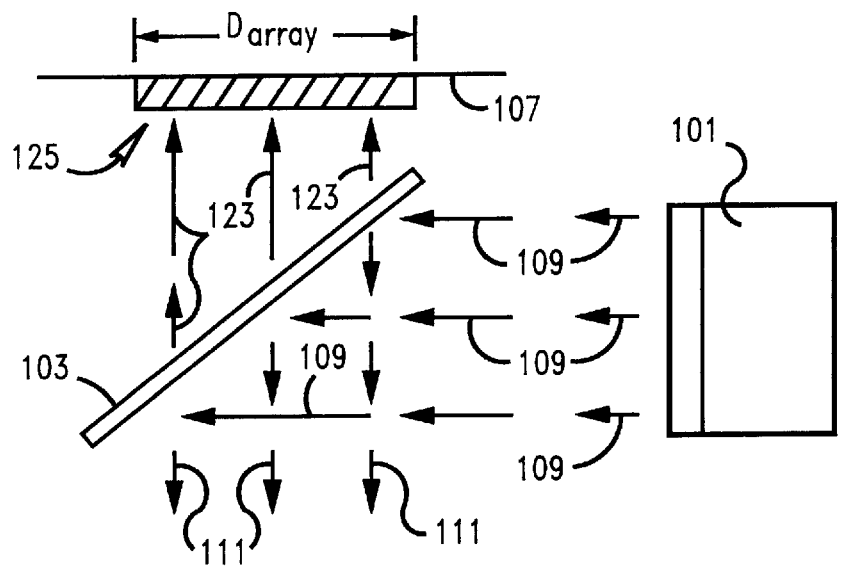
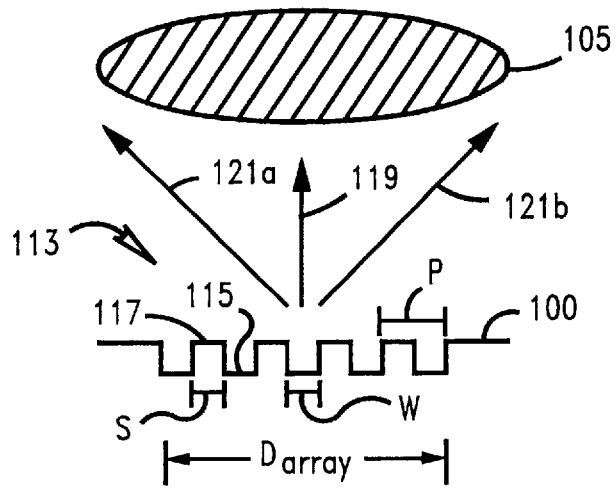
FIG. 7
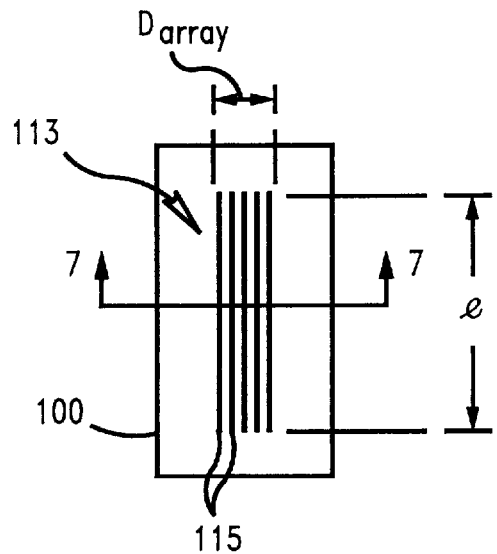
FIG. 8

METHOD OF OPTICAL METROLOGY OF UNRESOLVED PATTERN ARRAYS

BACKGROUND OF THE INVENTION

1. Field of the Invention

The present invention relates generally to manufacturing processes requiring lithography and, more particularly, to monitoring of bias in lithographic and etch processes used in microelectronics manufacturing which is particularly useful for monitoring pattern features with dimensions on the order of less than 0.5 micron.

2. Description of Related Art

Lithography has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photo-active component (PAC) of the photoresist material, create a latent image in the photoresist. In some photoresist systems the latent image is formed directly by the PAC. In others (so-called acid catalyzed photoresists), the photo-chemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. Exposure and focus are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term "bias" is invariably used in conjunction with a process such as resist imaging, etching, developing etc. and described by terms such as image bias, etch bias, print bias etc.

Monitoring of pattern features and measurement of its dimensions (metrology) is typically performed using either a scanning electron microscope (SEM) or an optical tool. SEM metrology has very high resolving power and is capable of resolving features of the order of 0.1 micron. Unfortunately, SEM metrology is expensive to implement, relatively slow in operation and difficult to automate. In-line measurement of critical dimensions below 0.5 um must currently be made on SEM tools for the control of the lithography and etch sectors. Proposed alternatives, such as Atomic Force Microscopy, are, if anything, more expensive and inefficient. Although optical metrology overcomes the above drawbacks associated with SEM and AFM metrology, optical metrology systems are unable to resolve adequately for measurement of feature dimensions of less than about 1 micron.

Improvements in monitoring bias in lithographic and etch processes used in microelectronics manufacturing have been disclosed in U.S. patent application Ser. Nos. 08/359797, 08/560720 and 08/560851. In Ser. No. 08/560851, a method of monitoring features on a target using an image shortening phenomenon was disclosed. In Ser. No. 08/560720, targets and measurement methods using verniers were disclosed to measure bias and overlay error. In these applications, the targets comprised arrays of spaced, parallel elements having a length and a width, with the ends of the elements forming the edges of the array. While the targets and measurement methods of these applications are exceedingly useful, they rely on the increased sensitivity to process variation provided by image shortening.

Accordingly, there is still a need for a method of monitoring pattern features of arbitrary shape with dimensions on the order of less than 0.5 micron, and which is inexpensive to implement, fast in operation and simple to automate. There is a need for a process for determining bias which enables in-line lithography/etch control using optical metrology, and wherein SEM and/or AFM metrology is required only for calibration purposes.

Bearing in mind the problems and deficiencies of the prior art, it is therefore an object of the present invention to provide a method and target for determining bias and overlay error in patterns deposited as a result of lithographic processes.

It is another object of the present invention to provide a method and target which combines measurement of bias and overlay error in deposited patterns, and which utilize little space on a wafer substrate.

It is yet another object of the present invention to provide bias and edge overlay targets which are readable by optical microscopy.

It is another object of the present invention to provide bias and edge overlay targets which are human readable during substrate processing.

It is a further object of the present invention to provide a process for measuring bias using targets which are intentionally not resolved by the metrology tool employed.

Still other objects and advantages of the invention will in part be obvious and will in part be apparent from the specification.

SUMMARY OF THE INVENTION

The above and other objects, which will be apparent to those skilled in the art, are achieved in the present invention which provides a process for determining critical dimension bias or overlay error in a substrate formed by a lithographic process by initially providing an array of elements on a substrate, the array comprising a plurality of spaced, substantially parallel elements having a length and a width. The sum of the width of an element and the spacing of adjacent elements define a pitch of the elements. Ends or edges of the elements are aligned along a line forming opposite array edges, with the distance between array edges comprising the array width. Also provided is an optical metrology tool having a light source and an aperture for measuring the length of the array elements. The optical metrology tool is adjustable for one or more of i) wavelength of the light source, ii) numerical aperture value or iii) partial coherence. The process includes selecting the pitch of the elements, the wavelength of the light source, the numerical aperture and the partial coherence such that the pitch of the elements is less than or about equal to the ratio of the wavelength of the light source to the numerical aperture value of the optical metrology tool in the direction of the array edges. Subsequently, the edges of the array are resolved with the optical metrology tool and the width of the array is measured to determine bias or overlay error in the substrate.

Preferably, the pitch corresponds to a minimum feature formed on the substrate and during measurement of the width of the array individual elements are not resolved within the array. The length of the elements of the array may be greater than the width of the elements of the array and measurement is of the length of the elements, or a plurality of spaced elements comprising a row across the width of the array and measurement is of the length of the row of the elements.

In a preferred embodiment, useful where the pitch of the array differs in different directions, the optical metrology tool has a non-circular pupil and the numerical aperture value NA of the optical metrology tool in the direction of minimum array pitch is selected to be less than the numerical aperture value NA of the optical metrology tool in a direction of maximum array pitch, such that the array edges are resolved and individual elements are not resolved.

In a more preferred aspect, the present invention relates to a process for determining bias or overlay error in a substrate formed by a lithographic process. To practice the process, there is provided an array of elements on a substrate, the array comprising a plurality of spaced, substantially parallel elements having a length and a width. The sum of the width of an element and the spacing of adjacent elements define a pitch P of the elements. Ends of the elements are aligned along a straight line forming opposite array edges, with the distance between array edges comprising the array width. There is also provided an optical metrology tool having a light source and an aperture and objective for measuring the length of the array elements. The optical metrology tool is adjustable for one or more of i) wavelength of the light source $\lambda$, ii) numerical aperture value NA of the optical metrology tool in the direction of the array edges or iii) partial coherence $\sigma$. In the process, one selects the pitch P of the elements, the wavelength of the light source, the numerical aperture and the partial coherence such that:

$$P < \text{or} \approx \frac{\lambda}{NA(1+\sigma)}$$

whereby individual elements are not resolved within the array. The edges of the array are resolved with the optical metrology tool and the width of the array is measured to determine bias or overlay error in the substrate.

The numerical aperture value NA of the optical metrology tool in the direction of minimum array pitch may be selected to be less than the numerical aperture value NA of the optical metrology tool in a direction of maximum array pitch.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 1–6 illustrate top plan views of different target arrays useful in connection with the present invention.

FIG. 7 is a schematic of an optical metrology tool measuring a target array.

FIG. 8 is a top plan view of the target array shown in FIG. 7.

DETAILED DESCRIPTION OF THE PREFERRED EMBODIMENTS

Figure 9:
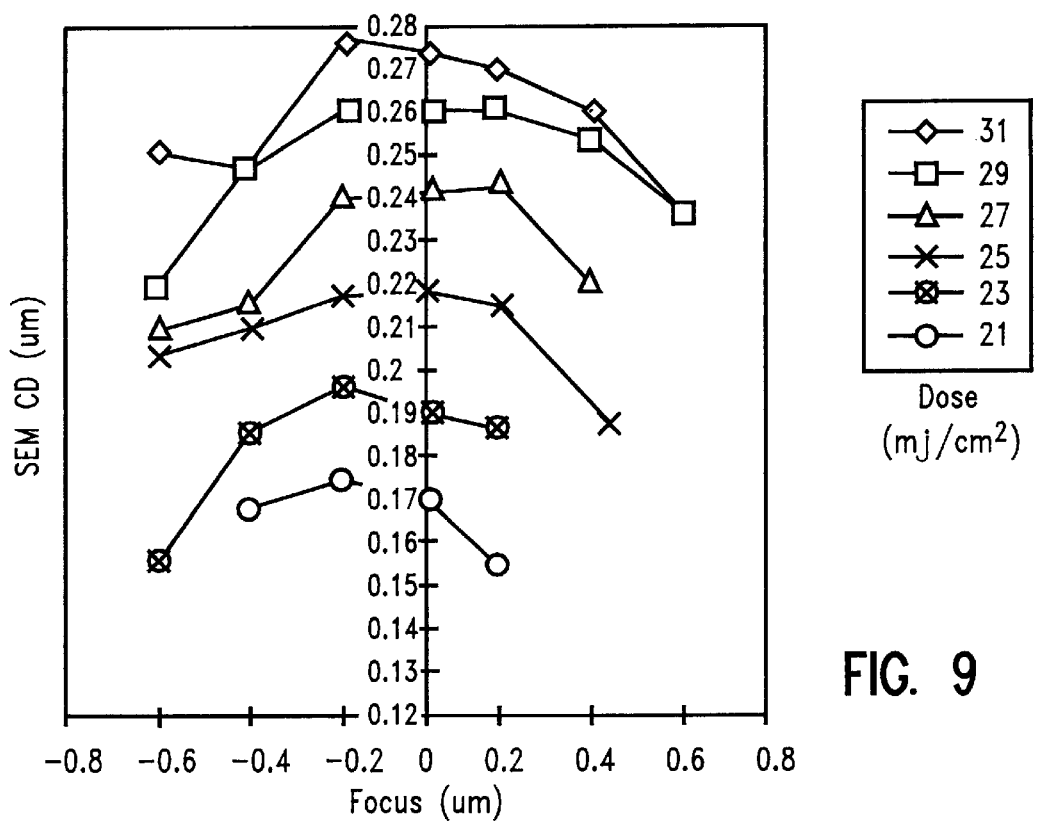
FIG. 9 is a graphical representation of SEM data on a single 0.3 $\mu$m contact on a substrate through focus and exposure matrix.
Figure 10:
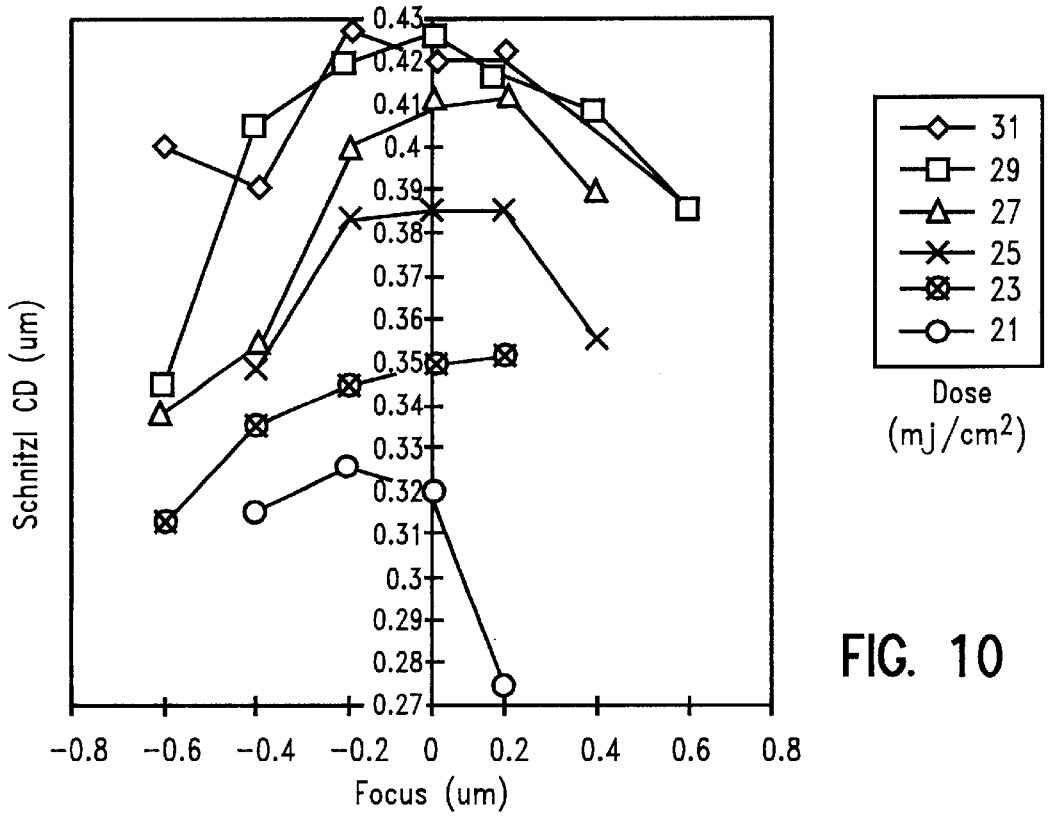
FIG. 10 is a graphical representation of optical array bias data in accordance with the method of the present invention through focus and exposure matrix.

In describing the preferred embodiment of the present invention, reference will be made herein to FIGS. 1–18 of the drawings in which like numerals refer to like features of the invention.

The methods and procedures for monitoring features during lithography by the phenomenon of "image shortening" as disclosed in U.S. application Ser. Nos. 08/359797, 08/560720 and 08/560851 are hereby incorporated by reference.

Measurement of unresolved pattern arrays has been accomplished using unmodified optical metrology tools whose primary task is overlay measurement in order to improve accuracy and precision of unresolved patterns metrology. The present invention applies an optical metrology method to detect the edges of pattern arrays made up of discrete patterns of the type used in image shortening arrays, while the array elements themselves are not resolved by the metrology system. The array elements can be any shape or orientation as long as they are configured so that the element edges at the ends of rows define an array edge.

A series of different array patterns useful in connection with the method of the present invention are shown in FIGS. 1–6. In each example the elements have a length and a width, and are aligned in rows such that ends of the elements form the edges of the arrays. FIG. 1 illustrates a pair of array patterns useful in applications where line end shortening is used, as described in the aforementioned incorporated applications. The array patterns have elements 120 extending horizontally whose element spacing is equal to the element width, and whose element width is less than the element length. Each element is continuous across the array width, and the element ends form opposite edges of the arrays. Each array has a width less than the array length.

FIG. 2 illustrates a pair of array patterns having elements 122 extending vertically whose element spacing is again equal to the element width, and whose element width is again less than the element length. Each element is also continuous across the array width, and the element ends form opposite edges of the arrays. However, each array has a width (equal to the element length) greater than the array length. The array edges are 90° to the direction of the length of elements 122.

FIG. 3 illustrates a pair of array patterns made up of discontinuous, staggered elements 124 extending in vertical rows. Again, element spacing is equal to the element width, and element width is less than the element length. However, each element in a vertical row (in the direction of its length) is spaced from adjacent elements by the same spacing as that between rows. The rows of elements are staggered so that the spacing between elements in a row is not aligned perpendicular to the rows, but is at an angle less than 90° thereto. The ends of the elements at the ends of the rows form array edge 124a which is at an angle less than 90° to direction of the row of elements.

FIG. 4 illustrates a pair of array patterns having elements 125 whose element spacing is again equal to the element width, and whose element width is again less than the element length. However, elements 125 extend at an angle of 45° to the array edges. Each element is continuous along its length, and the element ends form opposite edges of the arrays. The array width $D_{array}$ is 1.414×element length.

FIG. 5 illustrates a pair of array patterns made up of discontinuous, elements 126 extending in vertical rows. Again, element spacing is equal to the element width, but in this example each element is square so that element width is equal to element length and each element in a vertical row is spaced from adjacent elements by the same spacing as that between rows. The elements are aligned both vertically and horizontally so that the array edges are 90° to the direction of the vertical row of elements 122, but the elements may also be staggered in rows as shown in FIG. 3. The elements of an array pattern such as that shown in FIG. 5 may be made up of functional features, for example, 0.3μm diameter contacts, etched in a substrate, so that it would not be necessary to etch a separate target pattern into the substrate to check bias.

FIG. 6 illustrates a pair of array patterns made up of discontinuous, square elements 128 staggered in overlapping rows. Again, element spacing within a particular vertical row is equal to the element width, but each vertical row overlaps with an adjacent vertical row. The elements are aligned so that the element spacing between adjacent rows is less than 90° to the direction of the vertical row of elements.

The present invention is applicable to the control of all types of lithographic patterns, for example, lines, trenches, contacts and the like, where the array edge tracks the edge of individual elements with process variation. An important aspect of the present invention is the ability to modify the resolution of the optical metrology tool by way of wavelength of the light source and/or numerical aperture of the microscope in conjunction with the configuration of the pattern array, such that the individual elements of the array are not resolved and the edges of the array are resolved. The present invention requires no lower limit on the element dimensions. To achieve optimum measurement precision with smaller element dimensions, the resolution needs to be tuned such that the pitch of the array elements falls just below the inverse of the spatial frequency cutoff of the optical metrology system.

The spatial frequency cutoff ($F_c$) of an optical system is determined by its wavelength and numerical aperture, and the degree of coherence of its illumination. In general, $F_c$ is proportional to NA/wavelength and the minimum resolvable pitch $P_{min}$ is given by:

$$P_{min} \approx \frac{\lambda}{NA(1 + \sigma)}$$

where:
P—the sum of element width and element spacing in the target array
λ—the wavelength being used by the optical tool
NA—the numerical aperture of the microscope objective
σ—the partial coherence (or ratio of illumination NA to objective NA)

For example, if NA=0.5σ=0.5 and wavelength=500nm, $P_{min}$=670 nm. In this case, patterns having a pitch below 670 nm will be unresolved. A two-dimensional array of such structures would appear as a uniform change in intensity to the optical system over the area of the array, as compared to the background. Provided the array dimension ($D_{array}$) such as array width or array length is much greater than $P_{min}$ ($D_{array}>>P_{min}$), $D_{array}$ is measurable in the optical system.

Even though the individual elements of the array are not resolved, the measurable array dimension $D_{array}$ will track the dimensional variation of the elements. Thus, the optical measurement of the array enables in-line control of the element dimension.

Figure 12:
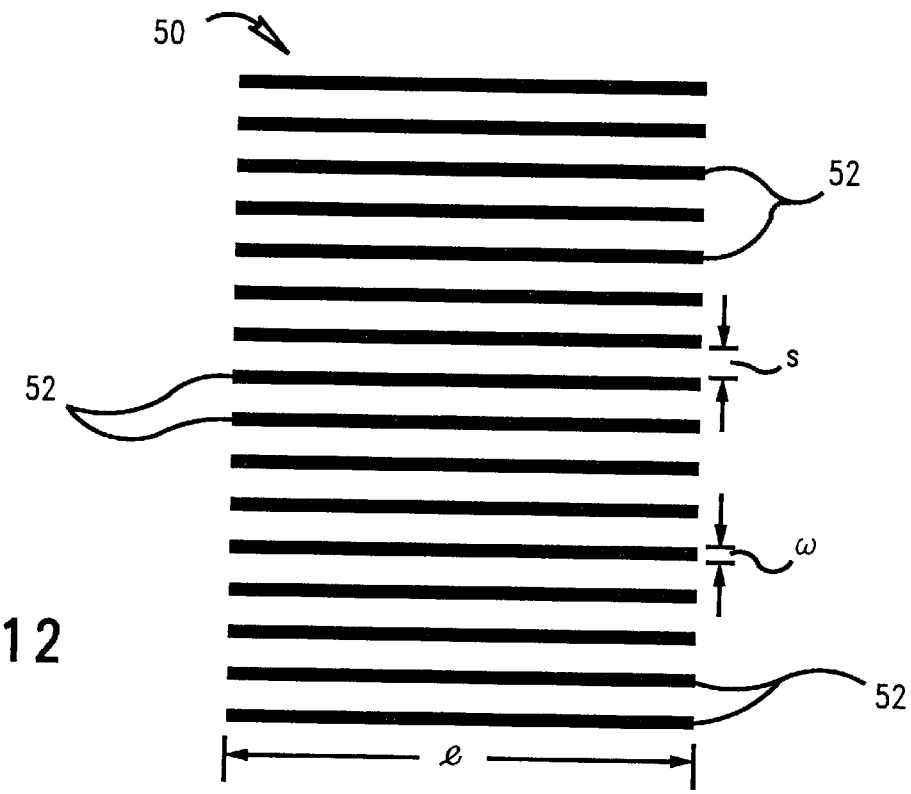
FIG. 12 is an embodiment of a line pattern shortening array useful in connection with the present invention.

In FIG. 7, an optical metrology tool comprises a light source 101, a beam splitter 103, a lens 105 and an image plane 107. The numerical aperture of Light beam 109 emitted from light source 101 has a wavelength λ. Beam splitter 103 comprises a partially transmitting mirror, such that a portion of the light intensity of beams 109 is reflected down as beam 111 through lens 105. Below lens 105 is a target array 113 (FIG. 8) comprising a plurality of elements 115 of width w and length/separated by spaces (troughs) of width s lithographically printed against a background substrate 100. Elements 115 can be continuous lines across the width of the array (equal to /), as shown in FIG. 12, or may be a series of discrete lines or dots extending across the array width. As shown in FIG. 12, w is equal to s, although in accordance with the method of the present invention w can also be greater than or less than s. The pitch of the elements P is equal to the sum of w and s. The values for w, s, NA, λ and σ are such that P is less than or equal to $\lambda/[NA(1+\sigma)]$. $D_{array}$ as shown equals (5×w)+(4×s), and is considerably greater than P. While / is greater than $D_{array}$ as seen in FIG. 8, / may also be equal to or less than $D_{array}$.

After light beams 111 pass through lens 105 and are focused on target 113, the beams are diffracted as image beams 119, 121a and 121b. As a result of the selection of element pitch, numerical aperture and wavelength in accordance with the method of the present invention, the individual elements 115 are not resolved with respect to the spaces 117 between the elements. Reflected beam 119 of 0 (zero) order passes straight up through lens 105 and through beam splitter 103 whereupon half emerge as beams 123. Beams 121a and 121b, diffracted from target 113, are of +1 and −1 order, respectively, and are diffracted outside of the capture area of the optical metrology tool.

Beams 123 form image 125 on image plane 107. The width of the image is $D_{array}$, i.e., equal to the width of target 113. However, because of the selection of P, λ, NA and σ, the individual elements and spaces are not resolved, and the interior of image 125 appears as a gray area, leaving only the target array edges resolved against the background. The pitch may have a fixed value and the light source wavelength, numerical aperture and coherence may be selected, or the light source wavelength may have a fixed value and the pitch, numerical aperture and coherence may be selected, or the numerical aperture may have a fixed value and the light source wavelength and pitch may be selected. As contemplated in the method of the present invention, the target is always contrasted against the background of the substrate. A microscope having control of these parameters (NA, λ, σ) is useful for measuring unresolved patterns, since the microscope can be tuned so that the array is just barely unresolved. Changing light source wavelength may introduce pattern contrast problems and decreasing σ may introduce edge ringing and other less desirable coherence issues. As such, it is preferred that the microscope parameter controlled is the numerical aperture value, NA, as may be controlled by a variable diameter pupil or iris.

Optionally to what is described in FIG. 7, a darkfield application of the optical metrology system will also be operable. Furthermore, other imaging approaches as can be envisioned with desirable asymmetric properties for measuring unresolved patterns. For example, confocal microscopes can be constructed with elliptical or rectangular spot shapes (rather than the usual circular spot shape) which can be oriented appropriately to the pattern under test. Also, a scatterometer which collects light scattered horizontally separately from light scattered vertically may be utilized for any desired array pattern to be measured. Every repeating pattern will have a Fourier spectrum which describes what angles light will scatter from the pattern. By collecting at these known scattering angles, through spatial filters, one can distinguish the areas containing the periodic pattern from those not containing the pattern with high resolution.

EXAMPLE 1

A substrate having lithographically printed contact hole of 300 nm size has been controlled using the method of the present invention. An array of 300 nm diameter contacts having a 600 nm pitch was measured through a focus-exposure matrix. The array dimension variation, as measured on a Biorad Optical Metrology Tool and shown in FIG. 10, correlated to that of the individual contacts, as measured on an Opal SEM and shown in FIG. 9. The measurement capability was shown to be a sensitive function of the optical resolution, since improved measurement capability was observed at lower, rather than higher, resolution. Best performance was observed using the red filter to achieve a 575–625 nm light wavelength, a numerical aperture of 0.7 and partial coherence of 0.5, such that individual contacts were unresolved.

Figure 11:
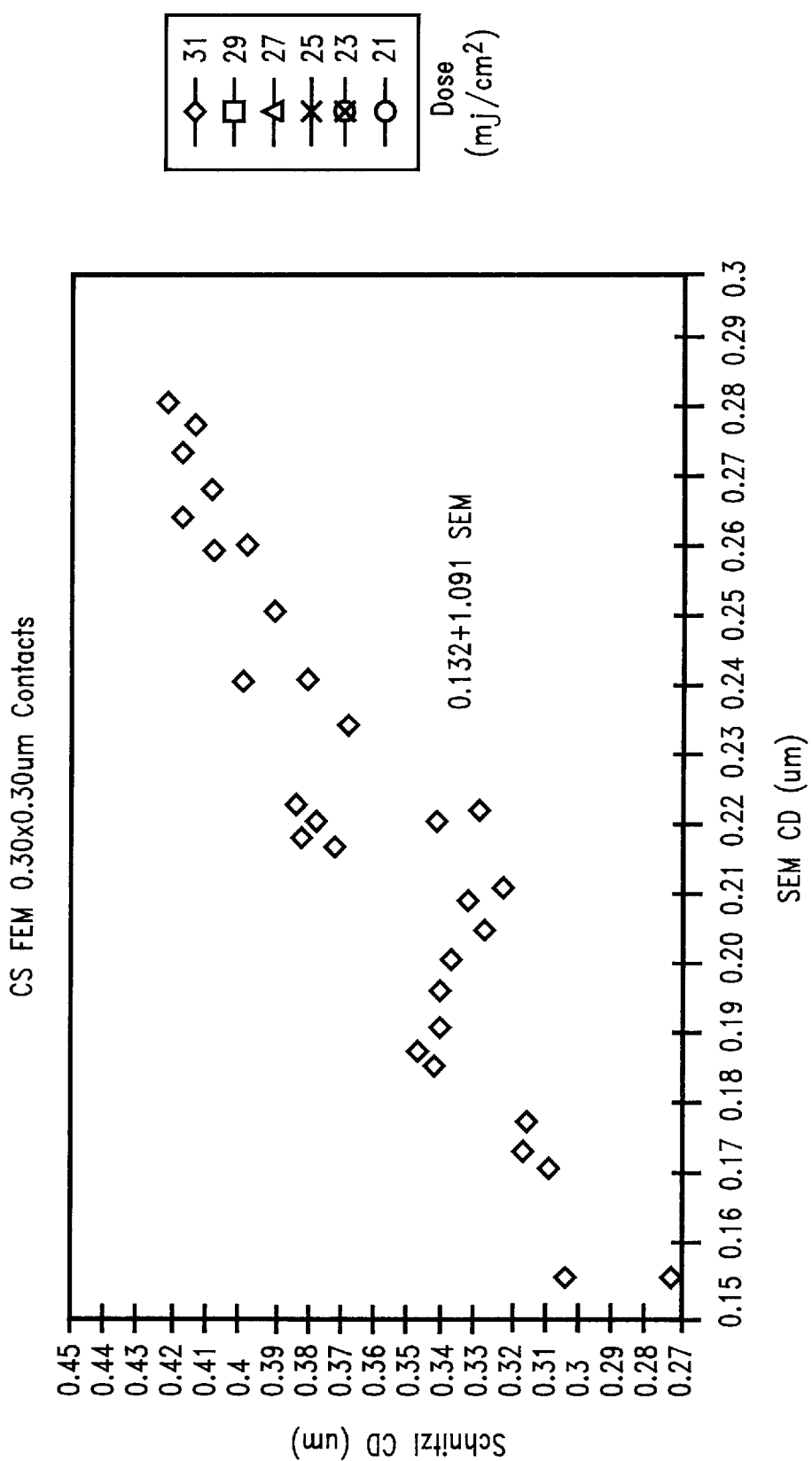
FIG. 11 is a graphical representation of correlation between SEM and optical array bias data showing 90% agreement over focus and exposure matrix.

The sensitivity and precision of the measurement technique of the present invention appears to be equal to or better than that of current SEMs due to the inherent averaging over many elements and the good focus repeatability of the Biorad system. Specifically, the sensitivity to dose/focus variation is illustrated in FIG. 11, which shows a plot of the array dimension versus the SEM critical dimension over the range of conditions used in the measurements shown in FIGS. 9 and 10. The best fit slope is approximately 1, indicating comparable sensitivity. Furthermore, the repeatability of the individual optical measurements is less than 7.5 nm (3 σ), as compared to SEM repeatability greater than 10 nm (3 σ). Accuracy of the present system may be checked by calibration to SEM cross-section and/or AFM profiles. Such calibration is anticipated to be infrequent due to the demonstrable stability of the optical metrology tool.

The contact hole array used in Example 1 places the most severe constraint on the optical resolution because the array pitch is equal along the length and width of the array. Even under this condition the precision of the optical measurement of the array width is superior to the SEM measurement of the individual contact. In instances where the pitch of the array patterns differs in different directions, the metrology optics can be further optimized for the particular pattern being used by using spatial filter techniques.

Figure 13:
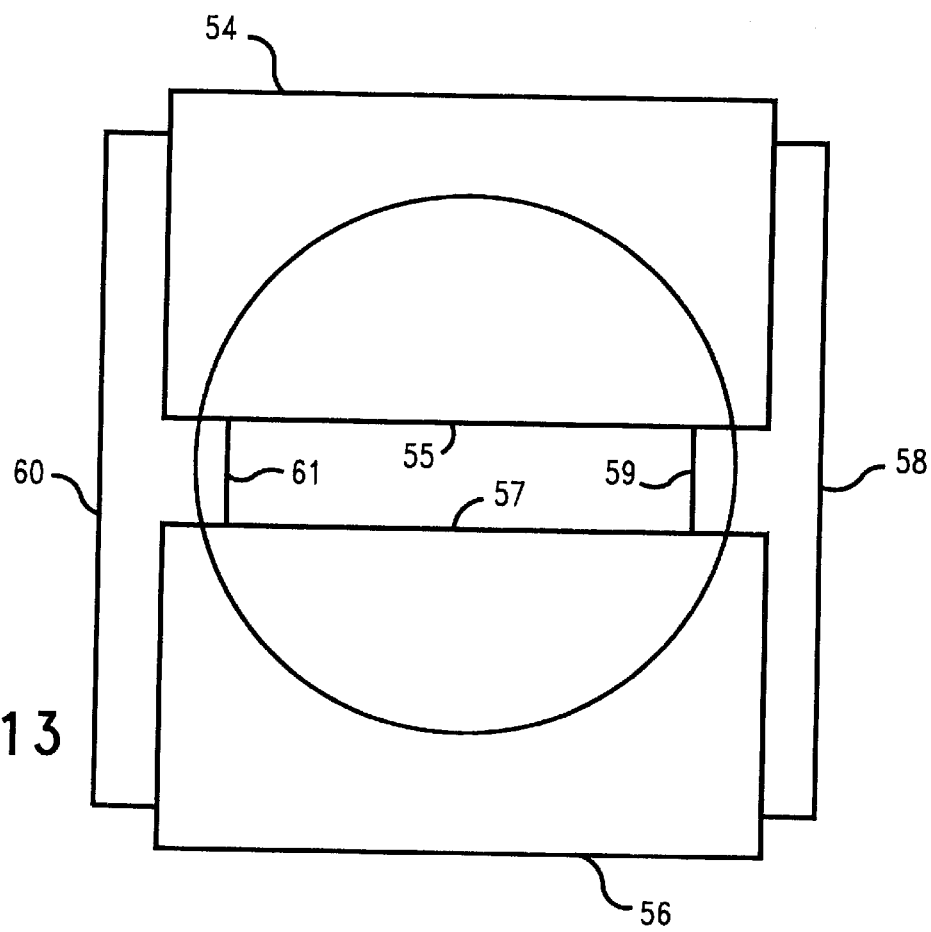
FIG. 13 is a top plan view of a non-circular pupil aperture which may be adjusted to provide different numerical aperture values in the vertical and horizontal directions.

One spatial filter method is the use of a noncircular pupil aperture, e.g., a rectangular or elliptical shape. By this method, the optical resolution can be made low in one direction, so as not to resolve the pattern, and high in another direction, so as to make a sharp measurement. In the specific example of the line-shortening pattern shown in FIG. 12, it is desirable to have less resolution in the vertical direction, so as not to resolve the individual lines, while simultaneously having higher resolution in the horizontal direction, so as to make a precise measurement of the line length. This may be achieved by use of a non-circular aperture having a variable aperture in both horizontal and vertical directions. One preferred embodiment of this approach would consist of a four (4) bladed programmable aperture at the Fourier plane of the microscope objective, as shown in FIG. 13. Blades 54, 56 are movable toward and away from each other in the vertical direction and have inner pupil edges, 55, 57, respectively. Blades 58, 60 are movable toward and away from each other in the horizontal direction and have inner pupil edges 59, 61, respectively. Inner edges 55, 57, 59, 61 define the pupil of the microscope objective. By moving these 4 blades, different rectangular apertures can be defined which can be optimized to the known array patterns to be measured. Any other configuration of a non-circular aperture filter may be used.

EXAMPLE 2

Figure 14:
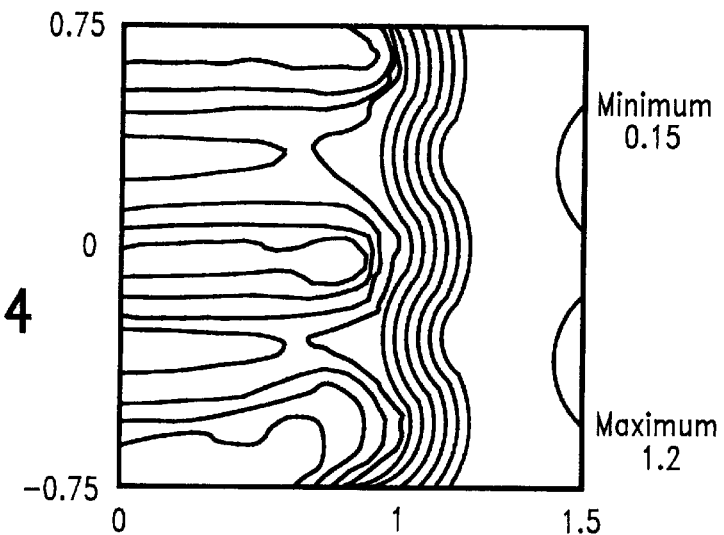
FIG. 14 shows the image contours of a simulation of an array pattern in which individual elements in the array have been resolved by the optical metrology tool.
Figure 15:
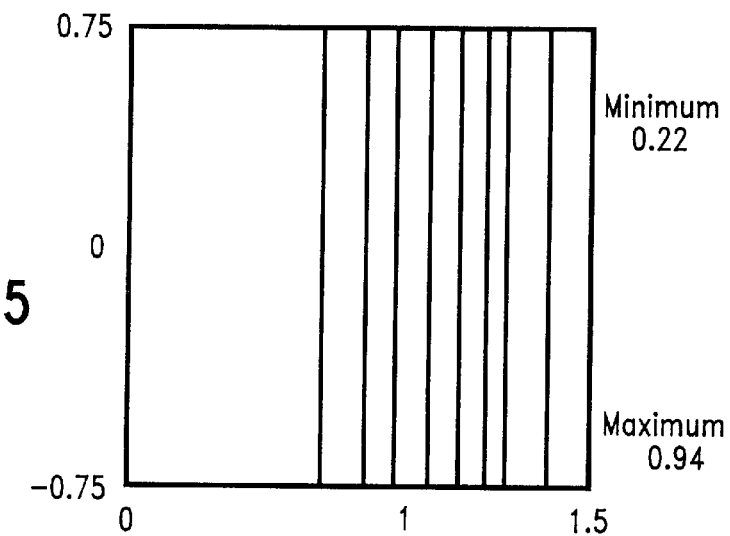
FIG. 15 shows the image contours of a simulation of an array pattern in which individual elements in the array have not been resolved by the optical metrology tool.
Figure 16:
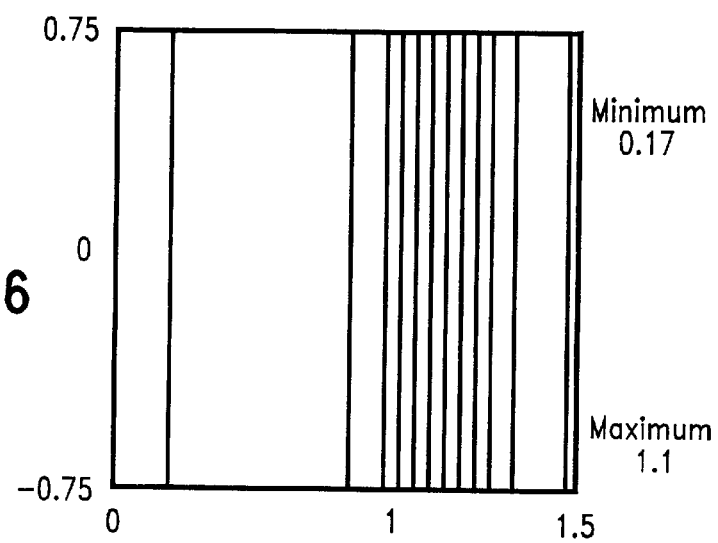
FIG. 16 shows the image contours of a simulation of an array pattern in which individual elements in the array have not been resolved by the optical metrology tool while the edges of the array have been resolved.

Simulations have been performed to confirm the advantages of the above approach for the line-shortening pattern of FIG. 12, in which the array 50 consists of a number of lines or elements 52 which have a width w of 350 nm, a length / of 2 microns, and spacing s between elements of 350 nm. The width of the array equals the length /, i.e., 2 microns. The ends of elements 52 form the array edges. The length of the array equals the number of elements, 16, times the element width, 350 nm, plus the number of spaces, 15, times the spacing, 350 nm, or 10.85 microns. Image simulations have been made for this array pattern for three different imaging situation, with the image contours shown in FIGS. 14–16. FIG. 14 shows a normal high resolution objective with a circular NA=0.7 with λ=500 nm and σ=0.5. The edge of the line-shortening pattern shows distinctive ripples, due to the individual lines being resolved, which makes more difficult the task of measuring the line length. FIG. 15 shows a normal low resolution objective, with a 0.37 NA objective and σ=0.95. The individual horizontal lines are now completely unresolved. In this figure, the image profile slope is somewhat degraded, as can be seen by the relatively wide spacing of the contour lines. FIG. 16 shows contours using a rectangular pupil filter similar to FIG. 13, where the horizontal NA is 0.7 and the vertical NA has been reduced to 0.37, as may be achieved by use of a non-circular pupil. Again, the individual lines are completely unresolved. However, the image slope has increased by about a factor of two in the measurement direction. Thus, utilizing a non-circular pupil with selectively different numerical aperture values in horizontal and vertical directions provides for the desired resolution of array edges, without resolution of the individual array elements.

Figure 17:
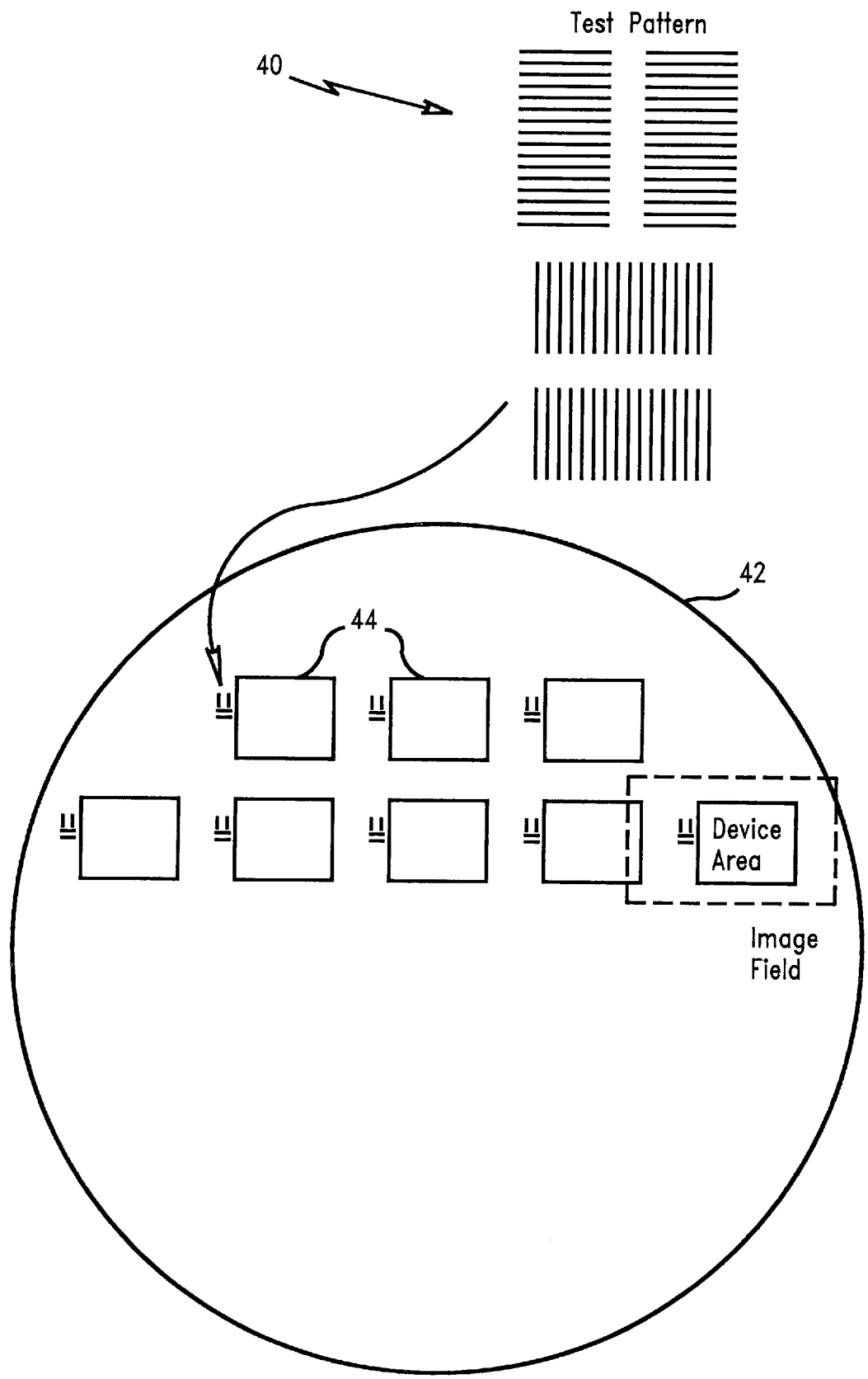
FIG. 17 is a top plan view of implementation of a test pattern on a product wafer.

Referring now to FIG. 17, for product monitoring and control, any of the array patterns useful in the present invention, for example, test pattern 40, may be printed in conjunction with the desired device pattern on the product wafer 42. To represent the product, the elements of the test pattern 40 should have a width and pitch smaller than or equal to (corresponding to) that of the most critical feature of the device pattern. Depending on the application, test pattern 40 can contain a plurality of array lines, the minimum width and space of the arrays can be varied to cover a range of dimensions below and above the intended design minimum features or the minimum capability of the lithographic process and tool. At a minimum, at least one array of lines will constitute the test pattern. As shown in FIG. 17, test patterns 40 can be distributed over any areas not occupied by the product patterns 44 and/or other requisite alignment and measurement patterns. Optionally, when resist/etch image characterization is the objective, similar test patterns of varying line width and patch can be distributed throughout the image field and wafer.

Figure 18:
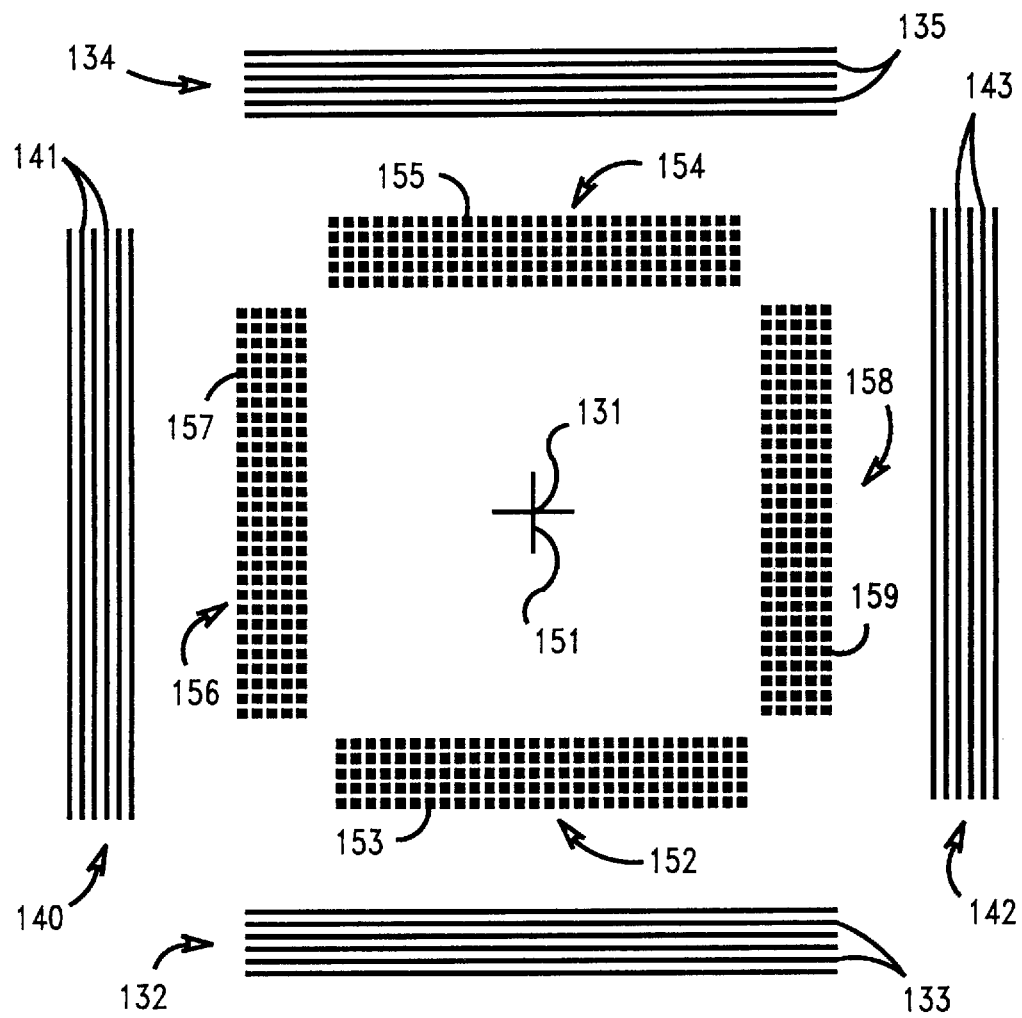
FIG. 18 is a top plan view of an embodiment of overlay target arrays useful in connection with the present invention.

An embodiment of an overlay target made up of level specific arrays is depicted in FIG. 18. A first target portion on one level of a substrate is shown comprised of arrays 132 and 134 oriented with elements 133, 135, respectively in the X direction (elements lengths parallel to the X-axis) and arrays 140 and 142 oriented with elements 141, 143, respectively in the Y direction (elements lengths parallel to the Y-axis). Element spacing is equal to element width in arrays 132, 134, 140 and 142. Opposite arrays are equidistant from target center point 131. Array pairs comprise separate targets wherein the nominal distance between facing edges of the array pairs (on the mask or reticle) is a predetermined, selected value. Likewise, array pairs 140, 142 also comprise separate targets arranged in a like manner.

A second target portion printed on another level of a substrate is comprised of arrays 152, 154, 156 and 158 having discrete, square elements 153, 155, 157 and 159, respectively, aligned in rows parallel to the X- and Y- axes. Opposite arrays are equidistant from target center point 151. Element spacing is equal to element width in arrays 152, 154, 156 and 158.

To determine edge overlay, the image of target arrays 132, 134, 140 and 142 is exposed and etched on one level of a substrate and the image of target arrays 152, 154, 156 and 158 is exposed and etched on a a different level the substrate such that the center points 131, 151 of the target portions are coincident and the X and Y orientation of the respective element lengths are preserved. The bias and overlay error may be calculated for the X and Y directions by measurement of distances between edges within an array, or between arrays on the same or different levels. Measurements may be made during processing to check both exposure and development of the desired device pattern and subsequent etching of the pattern into the wafer substrate. The target depicted in FIG. 18 may also be used as a direct replacement for a conventional box-in-box target employed in the prior art.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining bias or overlay error in a substrate formed by a lithographic process comprising the steps of:
   a) providing an array of elements on a substrate, the array comprising a plurality of spaced, substantially parallel elements having a length and a width, the sum of the width of an element and the spacing of adjacent elements defining a pitch of said elements, edges of said elements being aligned along a line forming opposite array edges, the distance between array edges comprising the array width;
   b) providing an optical metrology tool having a light source and an aperture for measuring the length of the array elements, said optical metrology tool being adjustable for one or more of i) wavelength of said light source, ii) numerical aperture value or iii) coherence;
   c) selecting the pitch of said elements, the wavelength of said light source and the numerical aperture such that the pitch of said elements is less than or approximately equal to the ratio of the wavelength of the light source to the numerical aperture value of the optical metrology tool in the direction of the array edges; and
   d) resolving the edges of said array with said optical metrology tool and measuring the width of said array to determine bias or overlay error in said substrate.

2. The method of claim 1 wherein said pitch corresponds to a minimum feature formed on said substrate.

3. The method of claim 1 wherein during step (d) individual elements are not resolved within said array.

4. The method of claim 1 wherein said pitch is a fixed value and wherein step (c) includes selecting the light source wavelength, said numerical aperture and said coherence.

5. The method of claim 1 wherein the light source wavelength is a fixed value and wherein step (c) includes selecting said pitch, said numerical aperture and said coherence.

6. The method of claim 1 wherein said numerical aperture is a fixed value and wherein step (c) includes selecting the light source wavelength and said pitch.

7. The method of claim 1 wherein the length of the elements of said array is greater than the width of the elements of said array and said step (d) comprises measuring the length of said elements.

8. The method of claim 1 wherein a plurality of spaced elements comprise a row across the width of said array and said step (d) comprises measuring the length of the row of said elements.

9. The method of claim 1 wherein the optical metrology tool has a non-circular pupil and wherein in step (c) the numerical aperture value NA of the optical metrology tool in the direction of the array edges is selected to be different from the numerical aperture value NA of the optical metrology tool in a direction normal to the array edges such that the array edges are resolved and individual elements within the array are not resolved.

10. The method of claim 1 wherein said elements comprise functional features formed in an array on said substrate, and wherein said step (d) includes measuring the edges of said array of functional features.

11. A method of determining bias or overlay error in a substrate formed by a lithographic process comprising the steps of:
a) providing an array of elements on a substrate, the array comprising a plurality of spaced, substantially parallel elements having a length and a width, the sum of the width of an element and the spacing of adjacent elements defining a pitch of said elements, ends of said elements being aligned along a straight line forming opposite array edges, the distance between array edges comprising the array width;
b) providing an optical metrology tool having a light source and an aperture and objective for measuring the length of the array elements, said optical metrology tool being adjustable for one or more of i) wavelength of said light source $\lambda$, ii) numerical aperture value NA of the optical metrology tool in the direction of the array edges or iii) partial coherence $\sigma$;
c) selecting the pitch P of said elements, the wavelength of said light source, the numerical aperture and the partial coherence such that $$P < \text{or} \approx \frac{\lambda}{NA\,(1\sigma)}$$

whereby individual elements are not resolved within said array; and
d) resolving the edges of said array with said optical metrology tool and measuring the width of said array to determine bias or overlay error in said substrate.

12. The method of claim 11 wherein in step (c) the numerical aperture value NA of the optical metrology tool in the direction of the array edges is selected to be different from the numerical aperture value NA of the optical metrology tool in a direction normal to the array edges.

13. The method of claim 11 wherein said pitch is a fixed value and wherein step (c) includes selecting the light source wavelength, said numerical aperture and partial coherence.

14. The method of claim 11 wherein the light source wavelength is a fixed value and wherein step (c) includes selecting said pitch, said numerical aperture and said partial coherence.

15. The method of claim 11 wherein said numerical aperture is a fixed value and wherein step (c) includes selecting the light source wavelength and said pitch.

16. The method of claim 11 wherein the length of the elements of said array is greater than the width of the elements of said array and said step (d) comprises measuring the length of said elements.

17. The method of claim 11 wherein a plurality of spaced elements comprise a row across the width of said array and said step (d) comprises measuring the length of the row of said elements.

18. The method of claim 11 wherein the length of the elements is less than the width of said array and said step (d) comprises measuring the sum of lengths of said elements in a row across the width of said array.

19. The method of claim 11 wherein the optical metrology tool has a non-circular pupil and wherein in step (c) the numerical aperture value NA of the optical metrology tool in the direction of the array edges is selected to be different from the numerical aperture value NA of the optical metrology tool in a direction normal to the array edges such that the array edges are resolved and individual elements within the array are not resolved.

20. The method of claim 11 wherein said elements comprise functional features formed in an array on said substrate, and wherein said step (d) includes measuring the edges of said array of functional features.

* * * * *

UNITED STATES PATENT AND TRADEMARK OFFICE
CERTIFICATE OF CORRECTION

PATENT NO.   : 5,805,290
DATED        : September 8, 1998
INVENTOR(S)  : Ausschnitt et al.

It is certified that error appears in the above-identified patent and that said Letters Patent is hereby corrected as shown below:

In column 11, line 35 between "1" and "σ"

insert - -"+" - -

Signed and Sealed this

Twenty-second Day of August, 2000

Attest:

Attesting Officer

Q. TODD DICKINSON
Director of Patents and Trademarks